(12) United States Patent
Yoshimoto et al.

(10) Patent No.: US 10,807,400 B2
(45) Date of Patent: Oct. 20, 2020

(54) PHOTOSENSITIVE RESIN COMPOSITION FOR RELIEF PRINTING ORIGINAL PLATE AND RELIEF PRINTING ORIGINAL PLATE OBTAINED THEREFROM

(71) Applicant: TOYOBO CO., LTD., Osaka-shi, Osaka (JP)

(72) Inventors: Kazuya Yoshimoto, Okayama (JP); Atsushi Tatsuyama, Okayama (JP); Jun Hasuike, Okayama (JP)

(73) Assignee: TOYOBO CO., LTD., Osaka-shi (JP)

( * ) Notice: Subject to any disclaimer, the term of this patent is extended or adjusted under 35 U.S.C. 154(b) by 0 days.

(21) Appl. No.: 15/754,398

(22) PCT Filed: Aug. 2, 2016

(86) PCT No.: PCT/JP2016/072627
§ 371 (c)(1),
(2) Date: Feb. 22, 2018

(87) PCT Pub. No.: WO2017/056692
PCT Pub. Date: Apr. 6, 2017

(65) Prior Publication Data
US 2018/0236804 A1    Aug. 23, 2018

(30) Foreign Application Priority Data

Sep. 28, 2015 (JP) ................. 2015-189208
Dec. 18, 2015 (JP) ................. 2015-247131

(51) Int. Cl.
| | |
|---|---|
| *B41N 1/12* | (2006.01) |
| *G03F 7/037* | (2006.01) |
| *C08G 69/26* | (2006.01) |
| *G03F 7/09* | (2006.01) |
| *B41C 1/02* | (2006.01) |
| *B41N 1/02* | (2006.01) |

(52) U.S. Cl.
CPC ............. *B41N 1/12* (2013.01); *B41C 1/02* (2013.01); *C08G 69/26* (2013.01); *G03F 7/037* (2013.01); *G03F 7/09* (2013.01)

(58) Field of Classification Search
None
See application file for complete search history.

(56) References Cited

U.S. PATENT DOCUMENTS

2010/0075117 A1 * 3/2010 Kawashima ............ B41C 1/05
428/195.1

FOREIGN PATENT DOCUMENTS

| JP | 4-97154 A | 3/1992 |
|---|---|---|
| JP | 5-11447 A | 1/1993 |
| JP | 6-313966 A | 11/1994 |
| JP | 9-171247 A | 6/1997 |
| JP | 2001-272776 A | 10/2001 |
| JP | 2002-23349 A | 1/2002 |
| JP | 2004-309783 A | 11/2004 |
| JP | 2009-271277 A | 11/2009 |
| JP | 2010-134223 A | 6/2010 |
| JP | 2012-68423 A | 4/2012 |
| JP | 2013-114136 A | 6/2013 |
| JP | 2013114136 A * | 6/2013 |
| JP | 2014-142622 A | 8/2014 |

OTHER PUBLICATIONS

Notification of Transmittal of Translation of the International Preliminary Report on Patentability (Form PCT/IB/338) issued in counterpart International Application No. PCT/JP2016/072627 dated Mar. 29, 2018, with Form PCT/IPEA/409. (4 pages).
International Search Report dated Oct. 25, 2016, issued in counterpart International Application No. PCT/JP2016/072627 (2 pages).
Extended (supplementary) European Search Report dated May 9, 2019, issued in counterpart EP Application No. 16850869.5. (7 pages).

* cited by examiner

*Primary Examiner* — Joshua D Zimmerman
(74) *Attorney, Agent, or Firm* — Westerman, Hattori, Daniels & Adrian, LLP

(57) ABSTRACT

The present invention provides a photosensitive resin composition for a relief printing original plate which can achieve both of a printing reproducibility of gradation of a highlight part and a printing durability, and can further achieve a low plate surface tackiness. A photosensitive resin composition for a relief printing original plate containing water-soluble or water-dispersible polyamide, a photopolymerizable unsaturated compound and a photopolymerization initiator as essential ingredients, characterized in that a total of a content of an alicyclic structural unit obtained from diamine and a content of an alicyclic structural unit obtained from dicarboxylic acid in the polyamide is 30 to 90 molar %, and the content of the alicyclic structural unit obtained from dicarboxylic acid in the polyamide is 20 molar % or more.

6 Claims, No Drawings

PHOTOSENSITIVE RESIN COMPOSITION FOR RELIEF PRINTING ORIGINAL PLATE AND RELIEF PRINTING ORIGINAL PLATE OBTAINED THEREFROM

TECHNICAL FIELD OF THE INVENTION

The present invention relates to a photosensitive resin composition for a relief printing original plate and also to a relief printing original plate obtained therefrom. More particularly, it relates to a water-developable photosensitive resin composition which can provide a relief printing original plate exhibiting an excellent printing reproducibility of gradation of a highlight part, an excellent printing durability, and a low plate surface tackiness.

BACKGROUND ART

It is usual that a photosensitive resin composition used for a printing plate generally contains a soluble polymer compound, a photopolymerizable unsaturated compound and a photopolymerization initiator as essential ingredients and, if necessary, additives such as stabilizer and plasticizer.

It has been already and widely known that a relief plate for printing is prepared by a photoengraving step wherein an active ray is irradiated to a photosensitive resin composition layer passing through a negative film having a transparent image part so that the photosensitive layer of an exposed part is hardened and, after that, the photosensitive layer of a non-exposed part is dissolved/removed using an appropriate solvent followed by drying and after-exposing.

As to the soluble polymer compound for the photosensitive resin composition, it has been proposed to use soluble polyamide, polyether urea urethane, completely saponified or partially saponified polyvinyl acetate, etc. Among them, a relief printing plate using soluble polyamide or polyether urea urethane has been used particularly preferably because it is excellent in abrasion resistance (see Patent Documents 1 and 2).

Recently, demand of users for a relief printing original plate makes progress to a direction of reproducing a hyper-fine pattern. As to the smallest highlight part used for printing a photographic product, it has been demanded that 5% or less of 200 lines exhibit such a reproducibility that a brightness changes smoothly in a printing size near a negative size (gradation of screen dots in a highlight part).

As to the prior art concerning the demand for printing property of fine screen dots of a highlight part, there are exemplified a relief printing original plate wherein an image reproducibility is enhanced by making a photosensitive resin layer into a multi-layered structure having different light transmittances (see Patent Document 3), and a relief printing original plate wherein a relief shape is made sharp by making a photosensitive resin layer into multiple layers (see Patent Document 4). However, any of the above relief printing original plates do not well satisfy the gradation of the screen dots in the highlight part. In addition, both of the above relief printing original plates result in an increase in a manufacturing cost due to use of the multiple layers.

There has been also proposed a method wherein information processed on a computer is directly depicted on a relief printing original plate whereby a printing plate is prepared without a necessity of a process for preparing a negative film (see Patent Document 5). According to this method, a scattering of light by the negative film does not occur whereby a relief shape becomes sharp and big improvement is noted in a printing property of a lined drawing. However, as to the gradation of the screen dots of the highlight part, it is not well satisfactory. Moreover, an expensive laser irradiation apparatus is necessary for photoengraving.

Incidentally, in the relief printing plate, there often happens such a problem that cracks are generated in the plate during a printing process whereby inferior printing product is resulted. In order to improve a printing durability, there have been proposed a method wherein partially saponified PVA and polyamide compound are jointly used (see Patent Document 6) and a method wherein a specific cross-linking agent is used (see Patent Document 7). Although some improvements are achieved by those methods, it is a current status that a well satisfactory printing durability has not been achieved yet.

PRIOR ART DOCUMENTS

Patent Documents

Patent Document 1: Japanese Patent Application Laid-Open (JP-A) No. 97154/92
Patent Document 2: Japanese Patent Application Laid-Open (JP-A) No. 11447/93
Patent Document 3: Japanese Patent Application Laid-Open (JP-A) No. 2002-23349
Patent Document 4: Japanese Patent Application Laid-Open (JP-A) No. 313966/94
Patent Document 5: Japanese Patent Application Laid-Open (JP-A) No. 171247/97
Patent Document 6: Japanese Patent Application Laid-Open (JP-A) No. 2001-272776
Patent Document 7: Japanese Patent Application Laid-Open (JP-A) No. 2014-142622

DISCLOSURE OF THE INVENTION

Problem that the Invention is to Solve

The present invention has been achieved in view of the current status of prior art as mentioned above. An object of the present invention is to provide a photosensitive resin composition for a relief printing original plate which can achieve both of a printing reproducibility of gradation of a highlight part and a printing durability, and can further achieve a low plate surface tackiness, and also to provide a relief printing original plate using the same.

Means for Solving the Problem

In order to achieve the above object, the inventors of the present application have eagerly conducted investigations for a water-soluble or water-dispersible polyamide for a photosensitive resin composition to be used in a relief printing original plate. As a result, they have found that both of a printing reproducibility of gradation of a highlight part and a printing durability can be achieved and a low plate surface tackiness can also be achieved when the polyamide is polymerized from dicarboxylic acid containing a specific amount or more of alicyclic dicarboxylic acid and a total amount of alicyclic diamine and the alicyclic dicarboxylic acid is within a specific amount. Consequently, the present invention has been accomplished.

Thus, the present invention has constitutions of the following (1) to (7).

(1) A photosensitive resin composition for a relief printing original plate containing water-soluble or water-dispersible polyamide, a photopolymerizable unsaturated compound and a photopolymerization initiator as essential ingredients, characterized in that a total of a content of an alicyclic structural unit obtained from diamine and a content of an alicyclic structural unit obtained from dicarboxylic acid in the polyamide is 30 to 90 molar %, and the content of the alicyclic structural unit obtained from dicarboxylic acid in the polyamide is 20 molar % or more.

(2) The photosensitive resin composition for a relief printing original plate according to (1), wherein a storage elastic modulus of the polyamide measured by a dynamic viscoelasticity measuring apparatus is 500 to 4000 Mpa.

(3) The photosensitive resin composition for a relief printing original plate according to (1) or (2), wherein alicyclic diamine becoming the alicyclic structure unit is at least one alicyclic diamine selected from a group consisting of isophoronediamine, 1,4-cyclohexanediamine, 1,3-cyclohexanediamine, 1,3-bis(aminomethyl)cyclohexane, 1,4-bis(aminomethyl)cyclohexane, norbornyldiamine, 1,4-bis-(3-aminopropyl)piperazine and N-(2-aminoethyl)-piperazine.

(4) The photosensitive resin composition for a relief printing original plate according to any of (1) to (3), wherein alicyclic dicarboxylic acid becoming the alicyclic structural unit is at least one alicyclic dicarboxylic acid selected from the group consisting of isophoronedicarboxylic acid, 1,4-cyclohexanedicarboxylic acid, 2,3-norbornane-dicarboxylic acid and 1,3-cyclohexanedicarboxylic acid.

(5) The photosensitive resin composition for a relief printing original plate according to any of (1) to (4), wherein the polyamide has a tertiary nitrogen atom.

(6) The photosensitive resin composition for a relief printing original plate according to any of (1) to (5), wherein the polyamide contains 10 to 70 molar % of a structural unit obtained from lactam and/or aminocarboxylic acid.

(7) A relief printing original plate containing a photosensitive resin layer comprising the photosensitive resin composition for a relief printing original plate according to any of (1) to (6).

Advantages of the Invention

According to the present invention, it is possible to provide a photosensitive resin composition for a relief printing original plate which can achieve both of a printing reproducibility of gradation of a highlight part of 1 to 5% and a printing durability, and can further achieve a low plate surface tackiness.

BEST MODE FOR CARRYING OUT THE INVENTION

The photosensitive resin composition for a relief printing original plate of the present invention contains water-soluble or water-dispersible polyamide, a photopolymerizable unsaturated compound and a photopolymerization initiator as essential ingredients.

The polyamide used in the present invention is a polyamide wherein a total of a content of an alicyclic structural unit obtained from diamine and a content of an alicyclic structural unit obtained from dicarboxylic acid in the polyamide is 30 to 90 molar %, and the content of the alicyclic structural unit obtained from dicarboxylic acid in the polyamide is 20 molar % or more.

When the total of the content of the alicyclic structural unit obtained from diamine and the content of the alicyclic structural unit obtained from dicarboxylic acid in the polyamide is less than the above range, a printing reproducibility of gradation of a highlight part is inferior and a plate surface tackiness is also inferior. On the contrary, when it is more than the above range, a printing durability of a polymer or, particularly, lacking resistance of screen dots of a highlight part is inferior. Further, when the content of the alicyclic structural unit obtained from dicarboxylic acid in the polyamide is less than the above range, the printing reproducibility of gradation of the highlight part is inferior and the plate surface tackiness is also inferior while, when it is more than the above range, the printing durability or, particularly, the lacking resistance of screen dots of the highlight part is inferior.

As to the alicyclic diamine, there are exemplified isophoronediamine, 1,4-cyclohexanediamine, 1,3-cyclohexane-diamine, 1,3-bis(aminomethyl)cyclohexane, 1,4-bis(amino-methyl)cyclohexane, 1-amino-3-methyl-3,5,5-trimethyl-cyclohexane, bis(4-aminocyclohexyl)methane, bis(3-methyl-4-aminocyclohexyl)methane, 2,2-bis(4-aminocyclohexyl)-propane, 1,4-bis(3-aminopropyl)piperazine, N-(2-aminoethyl)-piperazine, methylcyclohexanediamine, norbornanediamine and tricyclodecanediamine. Among them, isophoronediamine and 1,3-bis(aminomethyl)cyclohexane are preferred in view of the printing reproducibility of gradation of the highlight part.

As to the alicyclic dicarboxylic acid, there are exemplified isophoronedicarboxylic acid, 1,4-cyclohexane-dicarboxylic acid, 2,3-norbornanedicarboxylic acid, 1,3-cyclohexanedicarboxylic acid, 2-methyl-1,4-cyclohexane-dicarboxylic acid, 2-ethyl-1,4-cyclohexanedicarboxylic acid, 2-propyl-1,4-cyclohexanedicarboxylic acid, 2-butyl-1,4-cyclohexanedicarboxylic acid, 2-tert-butyl-1,4-cyclohexane-dicarboxylic acid, 2,3-dimethyl-1,4-cyclohexanedicarboxylic acid, 2,3-diethyl-1,4-cyclohexanedicarboxylic acid, 2,3-dipropyl-1,4-cyclohexanedicarboxylic acid, 2,3-dibutyl-1,4-cyclohexanedicarboxylic acid, 2-methyl-3-ethyl-1,4-cyclohexanedicarboxylic acid, 2-methyl-3-propyl-1,4-cyclohexanedicarboxylic acid, 2-methyl-3-butyl-1,4-cyclohexanedicarboxylic acid, 2-ethyl-3-propyl-1,4-cyclohexanedicarboxylic acid, 2-ethyl-3-butyl-1,4-cyclohexanedicarboxylic acid, 2-methyl-3-tert-butyl-1,4-cyclohexanedicarboxylic acid, 1,2-cyclohexane-dicarboxylic acid, 2,6-decalindicarboxylic acid, 3-methyl-2,6-decalindicarboxylic acid, 3-ethyl-2,6-decalin-dicarboxylic acid, 3-propyl-2,6-decalindicarboxylic acid, 3-butyl-2,6-decalindicarboxylic acid, 3,4-dimethyl-2,6-decalindicarboxylic acid, 3,4-diethyl-2,6-decalin-dicarboxylic acid, 3,4-dipropyl-2,6-decalindicarboxylic acid, 3,4-dibutyl-2,6-decalindicarboxylic acid, 3,8-dimethyl-2,6-decalindicarboxylic acid, 3,8-diethyl-2,6-decalin-dicarboxylic acid, 3,8-dipropyl-2,6-decalindicarboxylic acid, 3,8-dibutyl-2,6-decalindicarboxylic acid, 3-methyl-4-ethyl-2,6-decalindicarboxylic acid, 3-methyl-4-propyl-2,6-decalin-dicarboxylic acid, 3-methyl-4-butyl-2,6-decalindicarboxylic acid and 3-ethyl-4-butyl-2,6-decalindicarboxylic acid. Among them, 1,4-cyclohexane-dicarboxylic acid is preferred in view of the printing reproducibility of gradation of the highlight part.

The polyamide of the present invention may partially use an alicyclic aminocarboxylic acid. As to the alicyclic aminocarboxylic acid, there are exemplified 4-aminocyclohexanecarboxylic acid, 3-aminocyclohexane-carboxylic acid, 4-(aminomethyl)cyclohexanecarboxylic acid, 3-(aminomethyl)cyclohexanecarboxylic acid and 2-aminomethyl-cyclopropanecarboxylic acid.

A printing plate prepared from the relief printing original plate of the present invention can enhance the printing reproducibility of the highlight part by using polyamide having alicyclic structural units in a specific amount or more. It is likely that this is caused by the fact that a degree of freedom of molecular chain lowers by the alicyclic structural units whereby an elastic modulus of the polymer is enhanced. It is presumed that, as a result of enhancement of the elastic modulus of the polymer, a deformation of highlight screen dots is suppressed even when printing pressure is applied whereby the printing reproducibility is enhanced.

It is preferred that a storage elastic modulus of the polyamide used in the present invention measured by a dynamic viscoelasticity measuring apparatus is 500 to 4000 MPa. More preferably, it is 1000 to 3500 MPa. As to a method for making the storage elastic modulus within the above range, an introduction of a ring structure such as an aromatic ring or an aliphatic ring into the molecular chain may be exemplified.

As a result of using the polyamide having the storage elastic modulus within the above range, the plate surface tackiness can be also reduced. When the storage elastic modulus is less than the above range, the plate surface tackiness is high whereby an adhesion of paper powder generated from a printing paper onto the surface of printing plate increases upon printing and, as a result, there may happen an uneven adhesion of an ink caused by the paper powder adhered onto a solidly printed part. On the contrary, when the storage elastic modulus is more than the above range, the degree of freedom of the molecular chain is lost and the printing durability is deteriorated. The reason why the tackiness is reduced when the storage elastic modulus of a polymer compound is within the above range is likely to be that, when the storage elastic modulus is within the above range, the molecular chain of the polymer compound is in a frozen state whereby a molecular movement is suppressed.

It is preferred that the polyamide used in the present invention has a glass transition temperature (Tg) of 80 to 150° C. measured by a differential scanning calorimeter. More preferably, Tg is 90 to 140° C. An example of a method for making Tg within the above range is an introduction of a ring structure such as an aromatic ring or an aliphatic ring into the molecular chain. It has been known that, at a temperature of higher than Tg, micro-Brownian motion of the molecular chain becomes possible whereby an elastic modulus significantly lowers and that the Tg of polyamide also lowers due to absorption of moisture, etc. Accordingly, Tg is preferred to be 80° C. or higher for retaining the high elastic modulus even when the plate is warmed or moistened by a heat of abrasion, etc. during the printing. On the contrary, when Tg is higher than 150° C., a melt viscosity upon polymerization of the polyamide becomes too high and that is not preferred in view of a production of the polyamide.

It is necessary that the polyamide used in the present invention is soluble in water or dispersible in water (developable with water). In order to satisfy this condition, diamine or dicarboxylic acid having a polar group may be selected. As to the diamine, it may be selected from aliphatic diamine, aromatic diamine, heterocyclic diamine and alicyclic diamine. Among them, a diamine having a piperazine ring and a diamine containing tertiary nitrogen atom such as methylimino bispropylamine are preferred in view of a developability with water. It is particularly preferred to use the diamine having the piperazine ring in view of the elastic modulus of the polymer. As to the diamine having the piperazine ring, there are exemplified 1,4-bis(3-aminoethyl)piperazine, 1,4-bis(3-aminopropyl)-piperazine and N-(2-aminoethyl)piperazine.

It can be judged whether a polyamide is soluble in water or dispersible in water by such a means that the polyamide is solely dipped in water or in acidic water of 30° C. followed by rubbing with a brush or the like. When the polyamide is uniformly mixed with water or acidic water after it is physically rubbed with the brush or the like, the polyamide is judged to be soluble in water. On the contrary, when a part or all of the polyamide is swollen and dispersed in water whereby the polyamide is non-uniformly mixed, then the polyamide is judged to be dispersible in water.

As to the polyamide of the present invention, known diamines or dicarboxylic acids other than the alicyclic diamine or alicyclic dicarboxylic acid may be used within such an extent that they do not affect characteristic properties of the polyamide. As to the aliphatic diamine, there are exemplified ethylenediamine, diethylenediamine, 1,3-propylenediamine, 1,4-tetramethylenediamine, 2-methylpentamethylenediamine, 1,6-hexanediamine, 1,11-undecamethylenediamine, 1,12-dodecanediamine, 2,2,4 or 2,4,4-trimethyl-hexamethylenediamine and polyetheramine JEFFAMINE ED 900. As to the aromatic diamine, there are exemplified m- or p-xylylenediamine and m- or p-phenylenediamine.

As to the dicarboxylic acid used in the present invention, known aliphatic dicarboxylic acids other than the alicyclic dicarboxylic acid may be used. As to the aliphatic dicarboxylic acids, there are exemplified glutaric acid, adipic acid, sebacic acid and decanedicarboxylic acid. It is also possible to use aminocarboxylic acids other than the alicyclic aminocarboxylic acid.

Preferably, the polyamide of the present invention contains 10 to 70 molar % of a structural unit obtained from lactam and/or aminocarboxylic acid. As a result thereof, the elastic modulus of the resulting polyamide can be advantageously controlled.

The molar % of the alicyclic structural units of the polyamide of the present invention shows a ratio of a molar number of the alicyclic structural units to a total of a molar number of a structural unit obtained from aminocarboxylic acid, a molar number of a structural unit obtained from diamine, and a molar number of a structural unit obtained from dicarboxylic acid. The molar % of the alicyclic structural units can be calculated from molar numbers in a stage of charging materials or from a result of measurement of H-NMR. An analysis by means of H-NMR is a commonly used analytical method and is a method wherein molar % of each structural unit is calculated from integral values.

A polymerization of the polyamide according to the present invention may be carried out by known methods.

A molar ratio of diamine to dicarboxylic acid (amino group/carboxyl group) for polymerizing the polyamide of the present invention is 1.0 or more and preferably 1.01 or more. When the molar ratio is made within the above range, it is possible to take out the polymer after the polymerization becomes equilibrium and a variation of molecular weight can be suppressed.

As to the polyamide used in the present invention, it is preferred to conduct a copolymerization using diamine having a basic tertiary nitrogen atom in a molecule, dicarboxylic acid or aminocarboxylic acid. In that case, it is preferred, in view of a solubility in water, that a reaction with a quaternizing agent is conducted so as to make into a soluble polymer compound having an ammonium-type nitrogen atom. As to the quaternizing agent, it is possible to use known organic acids and an aliphatic organic acid and an aromatic organic acid can be used. As to specific examples of the organic acid, there are exemplified methacrylic acid, acrylic acid, succinic acid, adipic acid, sebacic acid, glycolic acid and lactic acid for the aliphatic organic acid while there are exemplified benzoic acid and isophthalic acid for the aromatic organic acid. In view of the water solubility, the aliphatic organic acid is preferred.

The amount of the polyamide used in the present invention is preferred to be 45 to 65% by weight in a total photosensitive resin composition. When the amount is less than 45% by weight, a physical property may not be sufficiently achieved while, when it is more than 65% by weight, a light curing property may become bad and an image reproducibility may lower. In order to satisfy both of the physical property and the image reproducibility, the amount is more preferred to be 50 to 65% by weight.

The photopolymerizable unsaturated compound used in the present invention is a compound containing one or more photopolymerizable unsaturated group (s) in a molecule and known ones may be used therefor. As to the compound containing one photopolymerizable unsaturated group in a molecule, there are exemplified a compound having one unsaturated bond such as 2-hydroxyethyl (meth)acrylate, 2-hydroxypropyl (meth)acrylate, 3-chloro-2-hydroxypropyl (meth)acrylate, cyclohexyl (meth)acrylate, benzyl (meth) acrylate, N,N'-dimethylaminoethyl (meth)acrylate, glycidyl (meth)acrylate, (meth)acrylamide, N-methylol-(meth)acrylamide, N-methylol (meth)acrylamide n-butyl ether, diacetacrylamide, N-tert-butyl (meth)acrylamide, an open-ring addition reaction product of glycidyl (meth)acrylate with monoalcohol and 2-acrylamido-2-methylpropanesulphonic acid. As to the compound containing two or more photopolymerizable unsaturated groups in a molecule, there are exemplified a compound having two or more unsaturated bonds such as ethylene glycol di (meth)acrylate, 1,3-propanediol di (meth)acrylate, 1,4-butanediol di (meth)acrylate, 1,6-hexanediol di (meth)acrylate, trimethylolethane di (meth)acrylate, trimethylolethane tri (meth)acrylate, trimethylolpropane di (meth)acrylate, trimethylolpropane tri (meth)acrylate, tetramethylolmethane di (meth)acrylate, tetramethylolmethane tri (meth)acrylate, tetramethylolmethane tetra (meth)acrylate, tri(meth)acryloyloxyethyl phosphate, triester of tris(2-hydroxyethyl)isocyanuric acid with (meth)acrylic acid and an open-ring addition reaction product of polyhydric alcohol polyglycidyl ether with (meth) acrylic acid [such as a reaction product of (poly)ethylene glycol diglycidyl ether with (meth)acrylic acid, a reaction product of diglycidyl ether of (poly)propylene glycol with (meth)acrylic acid, a reaction product of diglycidyl ether of 1,6-hexamethylene glycol with (meth)acrylic acid, a reaction product of glycerol diglycidyl ether with (meth)acrylic acid, a reaction product of trimethylolethane triglycidyl ether with (meth)acrylic acid, a reaction product of trimethylolpropane triglycidyl ether with (meth)acrylic acid, a reaction product of isophthalic acid diglycidyl ether with (meth)acrylic acid, a reaction of product of diglycidyl ether of dicarboxylic acid of isoprene oligomer with (meth)acrylic acid], an open-ring addition reaction product of other active hydrogen compound with glycidyl (meth)acrylate [such as a reaction product of (poly)ethylene glycol with glycidyl (meth)acrylate, a reaction product of (poly)propylene glycol with glycidyl (meth)acrylate, a reaction product of glycerol with glycidyl (meth)acrylate, a reaction product of 2-hydroxyethyl (meth)acrylate with glycidyl (meth)acrylate, a reaction product of trimethylolethane with glycidyl (meth) acrylate, a reaction product of trimethylolpropane with glycidyl (meth)acrylate, a reaction product of (meth)acrylic acid with glycidyl (meth)acrylate, a reaction product of aliphatic polycarbolylic acid with glycidyl (meth)acrylate and a reaction product of aromatic polycarboxylic acid with glycidyl (meth)acrylate)], a compound having two or more unsaturated groups obtained by a reaction of a compound having primary or secondary amino group with glycidyl (meth)acrylate, N,N'-methylenebis(meth)acrylamide, N,N'-ethylene-bis(meth)acrylamide, N,N'-propylenebis(meth) acrylamide, N,N'-hexamethylenebis(meth)acrylamide, N,N'-m-phenylene-bis(meth)acrylamide, N,N'-m-xylylenebis(meth)acrylamide, di(meth)acrylamide-N-methyl ether, 1,3-bis[(meth)acryloyl-aminomethyl]urea and derivatives thereof, 1,3-[bis(meth)acryloylaminomethyl]-1,3-dimethylurea and derivatives thereof, 1,3-[bis(meth)acryloylaminomethyl]-ethylene urea and derivatives thereof, 1,3-[bis (meth)acryloylaminomethyl]trimethylene urea and derivatives thereof, triacrylformal, tris(2-hydroxyethyl) isocyanuric acid tri(meth)acrylate, 1,3-diglycidyl-5-methyl-5-ethylhydantoin and others having two or more unsaturated bonds.

Although the photopolymerizable unsaturated compound may be used solely, it is also possible to use two or more thereof jointly. An amount of the photopolymerizable unsaturated compound used therefor is preferred to be 25 to 50% by weight in the total photosensitive resin composition. When the amount of the photopolymerizable unsaturated compound is more than 50% by weight, a mechanical strength may not be sufficiently achieved while, when it is less than 25% by weight, a light curing property may become bad whereby an image reproducibility may lower.

As to the photopolymerization initiator used in the present invention, known ones can be used and specific examples thereof are benzophenones, benzoins, acetophenones, benzyls, benzoin alkyl ethers, benzyl alkyl ketals, anthraquinones and thioxanthones. Advantageous specific examples thereof are benzophenone, benzoin, acetophenone, benzoin methyl ether, benzoin ethyl ether, benzyl dimethyl ketal, anthraquinone, 2-chloroanthraquinone, thioxanthone and 2-chlorothioxanthone. An amount of the photopolymerization initiator used therefor is preferred to be 0.05 to 5% by weight in the total photosensitive resin composition. When the amount is less than 0.05% by weight, an ability of initiating the photopolymerization is disturbed while, when it is more than 5% by weight, a light curing property in a thickness direction of a photosensitive resin layer of a printing original plate in a preparation of a relief for printing may lower whereby an image is apt to lack.

If necessary, known thermal polymerization inhibitor may be also added thereto. The thermal polymerization inhibitor is added in order to prevent an unexpected thermal polymerization by means of a heating in compounding, production, fabrication, etc. of the photosensitive resin composition or to prevent a dark reaction during a storage of the composition. As to the thermal polymerization inhibitor, there are exemplified hydroquinones (such as hydroquinone, mono-tert-butylhydroquinone, 2,5-di-tert-butylhydroquinone and hydroquinone monomethyl ether), benzoquinones (such as benzoquinone and 2,5-diphenyl-p-benzoquinone), phenols, catechols (such as catechol and p-tert-butylcatechol), aromatic amine compounds, picric acids, phenothiazine, α-naphthoquinones, anthraquinones, nitro compounds and sulfur compounds. An amount of the thermal polymerization inhibitor used therefor is preferably 0.001 to 2% by weight and especially preferably 0.005 to 1% by weight in the total photosensitive resin composition. Two or more of the compounds as such may be used jointly.

When the photosensitive resin composition of the present invention is molded in a constitution of an aimed laminate by means of any of known methods such as a melt molding, a heat press, a casting, a fused extrusion or a solution casting whereupon a relief printing original plate having a photosensitive resin layer can be obtained.

The relief printing original plate can be used by layering a molded product made into a sheet form (unexposed resin) on a support with or without a known adhesive. As to the support, anything such as steel, aluminum, glass or plastic film (such as polyester film) may be used, and a film in the thickness within a range of 50 to 500 µm is used. When the molded product made into the sheet form (unexposed resin) is supplied in a form of a layered product wherein the molded product is layered on the support, it is preferred that a protective film is further layered in contact with the molded product. As to the protective film, a filmy plastic may be used and, for example, a polyester film in 125 µm thickness may be used. Further, between the photosensitive resin layer and the protective film, an adhesion preventive layer may be arranged. The adhesion preventive layer may be famed by applying a transparent polymer which has no tackiness and which can be dispersed or dissolved in a developer, in a thickness of 0.5 to 3 µm. As a result of arranging the adhesion preventing layer on the surface of the photosensitive resin layer, the protective layer can be detached easily in a subsequent exposing operation, even when a surface tackiness is strong.

In the relief printing original plate according to the present invention, a cap layer of 1 to 30 µm thickness may be arranged between the photosensitive resin layer and the adhesion preventive layer. Since the cap layer is not removed in a developing step but remains on a printing plate, characteristic properties of a surface of the printing plate and a durability can be adjusted by arranging the cap layer. As to the cap layer, known cap layer may be used.

The relief printing original plate of the present invention can produce a CTP (Computer to Plate) plate which uses no negative film, by arranging a heat-sensitive mask layer on a surface of the photosensitive resin layer. As to the heat-sensitive mask layer, known heat-sensitive mask layer may be used.

A negative film having a transparent image part is layered by close adhesion to the photosensitive resin layer of the relief printing original plate obtained from the photosensitive resin composition of the present invention. Then, an active ray is irradiated from an upper side to expose so that only an exposed part of the photosensitive resin layer at which the active ray is irradiated is insolubilized. As to a light source of the active ray, there is usually used a light source such as a high-pressure mercury lamp, an ultrahigh-pressure mercury lamp, a metal halide lamp, a xenon lamp or a chemical lamp which mainly emits a light in a wavelength of 300 to 450 nm. On the contrary, in the case of a CTP plate, the heat-sensitive mask layer is irradiated with an IR laser in an image-wise manner whereby a mask (having the same function as the negative film) is formed on the photosensitive resin layer. Then, image information is inputted onto the heat-sensitive mask layer. Then, the active ray is irradiated onto a whole area of the photosensitive printing original plate via the mask so that only an exposed part of the photosensitive resin layer at which the active ray is irradiated is insolubilized.

Then, a non-exposed part is removed by dissolving in an appropriate solvent or, particularly in the present invention, in neutral water. The non-exposed part can be removed by a developing system such as a spray-type developing apparatus or a brush-type developing apparatus. After that, a printing plate wherefrom the non-exposed part is removed is subjected to straining, drying and after-exposing steps whereby a final printing plate is obtained.

It has been found that the relief printing original plate obtained from the photosensitive resin composition of the present invention is excellent in both of a printing property of gradation of a highlight part and a printing durability and, further exhibits a very low plate surface tackiness. As a result thereof, many copies in a high printing quality can be printed using a single plate when the relief printing original plate according to the present invention is used. In addition, as a result of a reduction of the plate surface tackiness, an adhesion of dust and paper powder before and during a printing can be reduced whereby a washing frequency for the plate for removing the adhered things can be greatly reduced.

EXAMPLES

The present invention will now be illustrated in more detail by way of Examples as hereunder although the present invention shall not be limited thereto. A team "part(s)" in Examples (text) stand (s) for part(s) by weight. Polyamide compositions in Table 1 are mentioned in molar %. A molar % of the polyamide composition was decided by a measurement of H-NMR. An evaluation of characteristic property data in Examples was done in accordance with the following methods.

(1) Printing Property of a Highlight Part (Printing Reproducibility of Gradation of a Highlight Part)

Firstly, a relief printing original plate having a photosensitive resin layer in a thickness of 685 µm was exposed with a light from a distance of 5 cm height from a surface of the photosensitive resin layer, using a negative for printing evaluation, using a chemical lamp wherein an illuminance was adjusted to 25 W/m$^2$, and adopting, as an optimum exposing time, a minimum exposing time necessary for reproducing 200 lines—1%. The negative for printing evaluation contains, as an image, a solid image (1 cm width×5 cm length) wherein screen dots were 200 lines-1% to 95%, a minimum independent dot diameter was 50 to 600 µm and a minimum independent line width was 10 to 150 µm. After that, the plate was developed by a brush-type washer (Nylon brush of 120 µm diameter; type JW-A2-PD manufactured by Nihon Denshi Seiki) using tap water of 25° C. whereupon a relief image was prepared. Then, it was dried by hot air of 60° C. for 10 minutes. After that, it was exposed with an ultrahigh-pressure mercury lamp for 30 seconds to give a printing plate. An image reproducibility of 200 lines-1% was judged by a naked eye using a loupe of 10 magnifications. The printing property of the highlight part was evaluated using the resulting printing plate. A rotary printing machine P-20 (manufactured by Sanjo Kikai) was used as a printing machine, Best Cure Indigo (manufactured by T&K TOKA) was used as an ink, and Gross PW-8K (manufactured by Lintec) was used as a thing to be printed. The evaluation of printing was conducted in such a manner that a printing pressure (a pressure between the plate and the thing to be printed) was gradually raised and a pressure at which a blurring of a solidly printed part disappeared was adopted as a proper pressure. Further, an ink feed amount was adjusted so that an ink concentration of the solidly printed part was made 1.7 abs. A screen dot concentration of 200 lines-1% to 5% under the proper pressure was measured using CCDOT 4 (manufactured by SDG). Results expressed in terms of % are shown in Table 1. The printing property of the highlight part is evaluated to be excellent when the screen dot concentration of a printed thing is near the screen dot concentration of the negative film and when the screen dot concentration of the printed thing smoothly decreases as the screen dot of the negative film decreases from 5% to 1%.

(2) Plate Surface Tackiness

A printing plate was prepared by the same method as the preparation method of the relief for evaluation of printing property of a highlight part mentioned in (1). Tackiness of a surface of a printing plate was evaluated using the resulting printing plate. A coated paper (Gross PW-8 K manufactured by Lintec) which was a thing to be printed was pressed to the plate, and a slipping degree of the coated paper was checked. The tackiness was evaluated according to the following criteria based on the slipping degree of the coated paper.

○: The coated paper slips without resistance

Δ: The coated paper adheres to the plate but it slips if force is applied thereto x: The coated paper and the plate stick each other and no slippage happens (3) Printing Durability (Cracking of the Solidly Printed Part)

A printing plate was prepared by the same method as the preparation method of the relief for evaluation of printing property of a highlight part mentioned in (1). Printing of 10,000 shots was conducted under such a state wherein a pressure was increased by 50 μm from a proper printing pressure. After the printing of 10,000 shots, printed things and the plate were observed under a microscope of 200 magnifications. The printing durability was evaluated according to the following judging criteria.

○○: No defect was noted in the printed things and no crack was noted in the plate as well.

○: Although no defect was noted in the printed things, slight crack was noted in the plate.

Δ: Although no defect was noted in the printed things by naked eyes, inferiority was noted by an observation under a microscope of 200 magnifications.

x: Inferiority was noted in the printed things by naked eyes.

(4) Printing Durability (Lacking in 1% Screen Dots)

The 1% screen dots of the plate obtained in the evaluation of (3) were enlarged under a microscope to 200 magnifications. The printing durability was evaluated according to the following judging criteria.

○: There was no change in 1% screen dots before and after the printing.

Δ: Less than 20% of the 1% screen dots lacked after the printing.

x: 20% or more of the 1% screen dots lacked after the printing.

(5) Elastic Modulus

Elastic modulus was measured under a pulling mode using a dynamic viscoelasticity measuring apparatus DVA 220 manufactured by IT Keisoku-Seigyo. Regarding measuring conditions, a temperature rising rate was 4° C./minute, a frequency was 10 Hz and a sample shape was 15 mm×4 mm under an air environment. The elastic modulus at 30° C. was defined as a storage elastic modulus.

(6) Glass Transition Temperature (Tg)

Glass transition temperature (Tg) was measured using DSC 100 manufactured by TA Instruments. Polyamide resin (10.0 mg) was placed in an aluminum pan and heated up to 300° C. at a temperature rising rate of 20° C./minute. It was kept for 3 minutes after reaching the temperature of 300° C. and, immediately thereafter, it was quenched in liquid nitrogen. After that, temperature was raised up to 300° C. at the temperature rising rate of 20° C./minute to determine the glass transition temperature (Tg). Tg was defined to be a temperature of a crossing point of a base line with a tangent line at an inflection point.

Example 1

ε-Caprolactam (339 parts), 596 parts of cyclohexanedicarboxylic acid, 514 parts of methyliminobispropylamine, 5 parts of 50% aqueous solution of hypophosphorous acid and 1000 parts of water were charged into an autoclave. After substituting with nitrogen, the autoclave was tightly closed and heated gradually. Starting from a stage wherein an inner pressure reached 0.4 MPa, water was distilled out until such a pressure was no longer maintained and, within about two hours, the pressure was returned to an ordinary pressure. After that, a reaction was conducted for 1 hour more under the ordinary pressure. The highest polymerization reaction temperature was 255° C. As a result thereof, there was obtained a polyamide having a glass transition temperature of 90° C., an elastic modulus of 1000 MPa and a relative viscosity of 2.10. A composition of the polyamide was measured by H-NMR. It was confirmed that there was no difference between a charged composition and a polymer composition.

The polyamide (55.0 parts) prepared as such was added to a mixture of 62 parts of methanol and 10 parts of water and dissolved by heating at 65° C., then 9.0 parts of diethylene glycol, 5.0 parts of lactic acid as a quaternizing agent and 0.1 part of hydroquinone monomethyl ether were added thereto and dissolved by stirring for 30 minutes and the polyamide was made into an ammonium salt so as to make into water-soluble. After that, 2.5 parts of glycidyl methacrylate (GMA), 1.0 part of benzyl dimethylketal (a photopolymerization initiator), 13 parts of glycerol dimethacrylate (Light Ester G101P manufactured by Kyoeisha Kagaku) and 14.5 parts of 2-hydroxy-3-acryloyloxypropyl methacrylate (Light Ester G201P manufactured by Kyoeisha Kagaku) were added thereto followed by stirring for 30 minutes to dissolve. After that, the temperature was gradually raised so that methanol and water were distilled off followed by concentrating until the temperature in the autoclave became 110° C. In this stage, a viscous photosensitive resin composition showing fluidity was prepared.

After that, a support having an adhesive layer was prepared. The support having an adhesive layer was prepared by coating a polyester film of 250 μm thickness with an adhesive composition containing an ultraviolet absorber in a coat thickness of 20 μm. The above photosensitive resin composition was flown onto the adhesive layer surface of the support. A raw plate of a laminate in a sheet foam having a total thickness of 1080 μm was molded by using a laminator in such a manner that a coated side of a polyester film of 125 μm thickness coated with a coat of polyvinyl alcohol (AH-24 manufactured by Nippon Synthetic Chemical) in 2 μm thickness contacts with the photosensitive resin composition.

After the raw plate was stored for seven days or longer, a printing property of a highlight part, a plate surface tackiness and a printing durability were evaluated. Result of the evaluation is shown in Table 1 together with the details of the polyamide in Example 1.

Examples 2 to 18 and Comparative Examples 1 to 4

Water-soluble polyamides were synthesized in the same manner as in Example 1. An elastic modulus and a glass transition temperature (Tg) of the polyamides were measured in the same manner as in Example 1. Photosensitive resin compositions were prepared using the resulting polyamides in the same manner as in Example 1 whereupon printing plates were manufactured. The resulting printing plates were subjected to the same evaluations as in Example 1. Result of the evaluation is shown in Table 1 together with the details of the polyamide in Examples 2 to 18 and Comparative Examples 1 to 4.

Example 19

A support having an adhesive layer was prepared by coating a polyester film of 250 μm thickness with an adhesive composition containing an ultraviolet absorber in a coat thickness of 20 μm. The photosensitive resin composition of Example 2 was flown onto the adhesive agent layer surface of the support. A raw plate of a laminate in a sheet form having a total thickness of 1080 μm was molded by using a laminator in such a manner that a polyester film of 125 μm thickness contacts with the photosensitive resin composition. The resulting plate was exposed with a chemical lamp of 25 W/m$^2$ from a distance of 5 cm height from a surface of a photosensitive resin layer. After that, a laser engraving (direct engraving) was conducted by using Flex-Pose ! direct wherein a laser engraving apparatus was installed with a 300 W carbonic acid gas laser manufactured by Luescher Flexo. An adhesion of engraving residues and adhesives was small. Sharp and fine relief dots were reproduced. A printing property of a highlight part, a plate surface tackiness and a printing durability were evaluated in the same manner as in Example 2. Excellent results were achieved in all of them.

TABLE 1

| | | | Example 1 | Example 2 | Example 3 | Example 4 | Example 5 | Example 6 |
|---|---|---|---|---|---|---|---|---|
| Polyamide compositions (molar %) | diamine | BAPP | | 35.4 | 20.0 | 20.0 | 20.0 | 20.0 |
| | | AEP | | | | | | |
| | | IPDA | | | | | 15.4 | 10.4 |
| | | 1,3BAC | | | | 15.4 | | 5.0 |
| | | MPDA | | | 15.4 | | | |
| | | methylimino bispropylamine | 35.4 | | | | | |
| | | HMDA | | | | | | |
| | dicarboxylic acid | adipic acid | | | | | | |
| | | CHDA | 34.6 | 34.6 | 34.6 | 34.6 | 34.6 | 34.6 |
| | | 2,3-norbornanedicarboxylic acid | | | | | | |
| | ε-caprolactam | | 30.0 | 30.0 | 30.0 | 30.0 | 30.0 | 30.0 |
| | ω-laurolactam | | | | | | | |
| Content of alicyclic structural unit obtained from dicarboxylic acid in the polyamide (molar %) | | | 34.6 | 34.6 | 34.6 | 34.6 | 34.6 | 34.6 |
| Total of content of alicyclic structural unit obtained from diamine and content of alicyclic structural unit obtained from dicarboxylic acid in the polyamide (molar %) | | | 34.6 | 70 | 54.6 | 70 | 70 | 70 |
| Tg of the polyamide (° C.) | | | 90 | 100 | 90 | 110 | 130 | 120 |
| Elastic modulus of the polyamide (MPa) | | | 1000 | 1500 | 1000 | 2000 | 2500 | 2000 |
| Evaluation items | Evaluation of printing property of highlight part | 5% | 8 | 7 | 8 | 7 | 7 | 7 |
| | | 3% | 6 | 5 | 6 | 5 | 5 | 5 |
| | | 2% | 5 | 4 | 5 | 4 | 4 | 4 |
| | | 1% | 5 | 4 | 5 | 3 | 3 | 3 |
| | Plate surface tackiness | | ○ | ○ | ○ | ○○ | ○○ | ○○ |
| | Printing durability | cracking of solidly printed part | ○ | ○ | ○ | ○ | ○ | ○ |
| | | lacking in 1% screen dots | ○ | ○ | ○ | ○ | ○ | ○ |

| | | | Example 7 | Example 8 | Example 9 | Example 10 | Example 11 | Example 12 |
|---|---|---|---|---|---|---|---|---|
| Polyamide compositions (molar %) | diamine | BAPP | 23.4 | 42.9 | | | | 20.0 |
| | | AEP | | | 20.0 | | | |
| | | IPDA | | | | | | 15.4 |
| | | 1,3BAC | | | 15.4 | 15.4 | | |
| | | MPDA | | | | | | |
| | | methylimino bispropylamine | | | | 20.0 | 42.9 | |
| | | HMDA | | | | | | |
| | dicarboxylic acid | adipic acid | | | | | | |
| | | CHDA | 22.6 | 42.1 | 34.6 | 34.6 | 42.1 | |
| | | 2,3-norbornanedicarboxylic acid | | | | | | 34.6 |
| | ε-caprolactam | | 54.0 | 15.0 | 30.0 | 30.0 | 15.0 | 30.0 |
| | ω-laurolactam | | | | | | | |
| Content of alicyclic structural unit obtained from dicarboxylic acid in the polyamide (molar %) | | | 22.6 | 42.1 | 34.6 | 34.6 | 42.1 | 34.6 |
| Total of content of alicyclic structural unit obtained from diamine and content of alicyclic structural unit obtained from dicarboxylic acid in the polyamide (molar %) | | | 46 | 85 | 70 | 50 | 42.1 | 70 |
| Tg of the polyamide (° C.) | | | 80 | 150 | 120 | 95 | 100 | 120 |
| Elastic modulus of the polyamide (MPa) | | | 1000 | 3500 | 2700 | 1400 | 1500 | 2300 |
| Evaluation items | Evaluation of printing property of highlight part | 5% | 8 | 7 | 7 | 7 | 6 | 7 |
| | | 3% | 6 | 5 | 5 | 6 | 5 | 5 |
| | | 2% | 5 | 4 | 4 | 5 | 4 | 4 |
| | | 1% | 4 | 4 | 3 | 4 | 4 | 3 |

TABLE 1-continued

|  |  |  |  |  |  |  |  |
|---|---|---|---|---|---|---|---|
| Plate surface tackiness | | ○ | ○○ | ○○ | ○ | ○ | ○○ |
| Printing durability | cracking of solidly printed part | ○ | ○ | ○ | ○ | ○ | ○ |
|  | lacking in 1% screen dots | ○ | Δ | ○ | ○ | ○ | ○ |

|  |  |  | Example 13 | Example 14 | Example 15 | Example 16 | Example 17 | Example 18 |
|---|---|---|---|---|---|---|---|---|
| Polyamide compositions (molar %) | diamine | BAPP | 20.0 | 20.0 | 20.0 | 23.4 | 42.9 | 35.4 |
|  |  | AEP |  |  |  |  |  |  |
|  |  | IPDA |  |  | 15.4 | 10.4 |  |  |
|  |  | 1,3BAC | 15.4 |  |  | 5.0 |  |  |
|  |  | MPDA |  |  |  |  |  |  |
|  |  | methylimino bispropylamine |  |  |  |  |  |  |
|  |  | HMDA | 15.0 | 15.0 | 15.0 | 27.0 | 7.5 |  |
|  | dicarboxylic acid | adipic acid | 15.0 | 15.0 | 15.0 | 27.0 | 7.5 |  |
|  |  | CHDA | 34.6 | 34.6 | 34.6 | 22.6 | 42.1 | 34.6 |
|  |  | 2,3-norbornanedicarboxylic acid |  |  |  |  |  |  |
|  | ε-caprolactam |  |  |  |  |  |  |  |
|  | ω-laurolactam |  |  |  |  |  |  | 30.0 |
| Content of alicyclic structural unit obtained from dicarboxylic acid in the polyamide (molar %) | | | 34.6 | 34.6 | 34.6 | 22.6 | 42.1 | 34.6 |
| Total of content of alicyclic structural unit obtained from diamine and content of alicyclic structural unit obtained from dicarboxylic acid in the polyamide (molar %) | | | 70 | 70 | 70 | 46 | 85 | 70.0 |
| Tg of the polyamide (° C.) | | | 115 | 135 | 125 | 85 | 150 | 90 |
| Elastic modulus of the polyamide (MPa) | | | 2100 | 2500 | 2200 | 1000 | 3500 | 1200 |
| Evaluation items | Evaluation of printing property of highlight part | 5% | 7 | 7 | 7 | 8 | 7 | 8 |
|  |  | 3% | 5 | 5 | 5 | 6 | 5 | 6 |
|  |  | 2% | 4 | 4 | 4 | 5 | 4 | 5 |
|  |  | 1% | 3 | 3 | 3 | 3 | 3 | 4 |
|  | Plate surface tackiness | | ○○ | ○○ | ○○ | ○ | ○○ | ○ |
|  | Printing durability | cracking of solidly printed part | ○ | ○ | ○ | ○ | ○ | ○ |
|  |  | lacking in 1% screen dots | ○ | ○ | ○ | ○ | Δ | ○ |

|  |  |  | Comparative Example 1 | Comparative Example 2 | Comparative Example 3 | Comparative Example 4 |
|---|---|---|---|---|---|---|
| Polyamide compositions (molar %) | diamine | BAPP | 17.9 | 17.0 | 17.4 | 18.0 |
|  |  | AEP |  |  |  |  |
|  |  | IPDA |  |  |  |  |
|  |  | 1,3BAC |  |  | 15.9 |  |
|  |  | MPDA |  |  |  | 29.9 |
|  |  | methylimino bispropylamine |  |  |  |  |
|  |  | HMDA |  |  |  |  |
|  | dicarboxylic acid | adipic acid | 17.1 | 32.1 |  |  |
|  |  | CHDA |  |  | 16.6 | 47.1 |
|  |  | 2,3-norbornanedicarboxylic acid |  |  |  |  |
|  | ε-caprolactam |  | 65.0 | 35.0 | 66.0 | 5.0 |
|  | ω-laurolactam |  |  |  |  |  |
| Content of alicyclic structural unit obtained from dicarboxylic acid in the polyamide (molar %) | | | 0.0 | 0.0 | 16.6 | 47.1 |
| Total of content of alicyclic structural unit obtained from diamine and content of alicyclic structural unit obtained from dicarboxylic acid in the polyamide (molar %) | | | 17.9 | 32.9 | 34.0 | 95 |
| Tg of the polyamide (° C.) | | | 20 | 30 | 60 | 190 |
| Elastic modulus of the polyamide (MPa) | | | 100 | 200 | 300 | 4500 |
| Evaluation items | Evaluation of printing property of highlight part | 5% | 10 | 10 | 9 | 7 |
|  |  | 3% | 9 | 9 | 8 | 5 |
|  |  | 2% | 8 | 8 | 7 | 4 |
|  |  | 1% | 8 | 7 | 7 | 4 |
|  | Plate surface tackiness | | x | x | Δ | ○○ |
|  | Printing durability | cracking of solidly printed part | ○ | ○ | ○ | ○ |
|  |  | lacking in 1% screen dots | ○ | ○ | ○ | x |

BAPP: 1,4-bis(3-aminopropyl)piperazine
AEP: N-(2-aminoethyl)-piperazine
IPDA: isophoronediamine
1,3BAC: 1,3-bis(aminomethyl)cyclohexane
MPDA: 2-methylpentamethylenediamine
HMDA: hexamethylenediamine
CHDA: 1,4-cyclohexanedicarboxylic acid It will be noted from Table 1 that, as shown in Examples 1 to 18, a gradation of 1 to 5% highlight screen dot, a tackiness and a printing durability were excellent when a polyamide is used, wherein a total of a content of an alicyclic structural unit obtained from diamine and a content of an alicyclic structural unit obtained from dicarboxylic acid in the polyamide is 30 to 90 molar %, and the content of the alicyclic structural unit obtained from dicarboxylic acid in the polyamide is 20 molar % or more. On the contrary, when a polyamide containing no alicyclic structural unit derived from dicarboxylic acid is used as shown in Comparative Examples 1 and 2, the printing property of highlight screen dots and the plate surface tackiness are inferior. Even when a polyamide containing an alicyclic structural unit derived from dicarboxylic acid is used as shown in Comparative Example 3, the gradation of highlight screen dot and the plate surface tackiness are inferior if the content thereof is less than 20 molar %. When the total of the content of the alicyclic structural unit derived from diamine and the content of the alicyclic structural unit derived from dicarboxylic acid in polyamide is 90 molar % or more as shown in Comparative Example 4, although the gradation of highlight screen dot is excellent, the printing durability (lacking of 1% screen dots) is significantly inferior.

INDUSTRIAL APPLICABILITY

In accordance with the photosensitive resin composition of the present invention, it is now possible to prepare a relief printing original plate exhibiting an excellent printing reproducibility of gradation of a highlight part of 1 to 5%, an excellent printing durability, and a low plate surface tackiness.

The invention claimed is:

1. A water-developable relief printing original plate comprising:
    a photosensitive resin layer comprising a photosensitive resin composition for a relief printing original plate, the photosensitive resin composition comprising
    water-soluble or water-dispersible polyamide,
    a photopolymerizable unsaturated compound, and
    a photopolymerization initiator,
    wherein a total of a content of an alicyclic structural unit obtained from diamine and a content of an alicyclic structural unit obtained from dicarboxylic acid in the polyamide is 30 to 90 molar %, and
    wherein, among the two types of the alicyclic structural units, the content of the alicyclic structural unit obtained from alicylic dicarboxylic acid in the polyamide is 20 molar % or more.

2. The water-developable relief printing original plate according to claim 1, wherein a storage elastic modulus of the polyamide measured by a dynamic viscoelasticity measuring apparatus is 1000 to 3500 Mpa.

3. The water-developable relief printing original plate according to claim 1, wherein alicyclic diamine becoming the alicyclic structure unit is at least one alicyclic diamine selected from a group consisting of isophoronediamine, 1,4-cyclohexanediamine, 1,3-cyclohexanediamine, 1,3-bis(aminomethyl)cyclohexane, 1,4-bis(aminomethyl)cyclohexane, norbornyldiamine, 1,4-bis-(3-aminopropyl)piperazine and N-(2-aminoethyl)-piperazine.

4. The water-developable relief printing original plate according to claim 1, wherein alicyclic dicarboxylic acid is at least one alicyclic dicarboxylic acid selected from the group consisting of isophoronedicarboxylic acid, 1,4-cyclohexanedicarboxylic acid, 2,3-norbornane-dicarboxylic acid and 1,3-cyclohexanedicarboxylic acid.

5. The water-developable relief printing original plate according to claim 1, wherein the polyamide has a tertiary nitrogen atom.

6. The water-developable relief printing original plate according to claim 1, wherein the polyamide contains 10 to 70 molar % of a structural unit obtained from lactam and/or aminocarboxylic acid.

* * * * *